US012150265B2

(12) United States Patent
Zhang et al.

(10) Patent No.: US 12,150,265 B2
(45) Date of Patent: Nov. 19, 2024

(54) SSD CARD ADAPTER BRACKET AND CIRCUIT BOARD ASSEMBLY

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Zhao-Li Zhang, Wuhan (CN); Yi-Sheng Lin, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 216 days.

(21) Appl. No.: 18/073,881

(22) Filed: Dec. 2, 2022

(65) Prior Publication Data

US 2023/0269897 A1 Aug. 24, 2023

(30) Foreign Application Priority Data

Feb. 23, 2022 (CN) .......................... 202220374426.3

(51) Int. Cl.
*H05K 7/10* (2006.01)
*H05K 1/18* (2006.01)

(52) U.S. Cl.
CPC ............ *H05K 7/1076* (2013.01); *H05K 1/18* (2013.01); *H05K 2201/10409* (2013.01)

(58) Field of Classification Search
CPC .......... H05K 7/10; H05K 7/1076; H05K 1/18; H05K 2201/10409
USPC .......................................................... 174/261
See application file for complete search history.

(56) References Cited

U.S. PATENT DOCUMENTS

| 4,924,355 A | * | 5/1990 | Mitchell | G06F 1/184 361/825 |
| 5,033,971 A | * | 7/1991 | Franks, Jr. | H01R 4/64 439/803 |
| 6,078,504 A | * | 6/2000 | Miles | G06F 1/184 361/752 |

* cited by examiner

*Primary Examiner* — Tremesha W Burns
(74) *Attorney, Agent, or Firm* — ScienBiziP, P.C.

(57) ABSTRACT

The present application provides an SSD card adapter bracket and a circuit board assembly. The SSD card adapter bracket includes a bracket member, a first screw, a conductive bouncing sheet, and a second screw. The bracket member includes a card base part and an extension part, and one side of the card base part is provided with a screw base. One side of the extension part is connected to the card base part, and the other side of the extension part is provided with a connection part. The first screw is threadedly connected to the screw base, and can press the SSD card to the screw base. The conductive bouncing sheet has a first end part and a second end part, the first end part is sandwiched between the first screw and the screw base, and the second end part corresponds to the connection part.

17 Claims, 8 Drawing Sheets

SSD CARD ADAPTER BRACKET AND CIRCUIT BOARD ASSEMBLY

FIELD

The present application relates to the field of electronic equipment, in particular to an SSD card adapter bracket and a circuit board assembly.

BACKGROUND

There are many known SSD cards, and these SSD cards may have many different sizes. In the known technology, in order to adapt to SSD cards of various sizes at the same time, it is necessary to set connection structures (such as support studs) respectively adapted to SSD cards of various sizes on the basic circuit board (such as a computer motherboard), which may increase the structural complexity and a cost of the basic circuit board.

Therefore, there is room for improvement in the art.

BRIEF DESCRIPTION OF THE DRAWINGS

In order to illustrate the technical solutions of the embodiments of the present application more clearly, the accompanying drawings in the embodiments will be briefly introduced below. It should be understood that the following drawings only show some embodiments of the present application, and therefore should not be seen as the limiting the scope. For one of ordinary skill in the art, other related drawings can also be obtained from these drawings without any creative work.

Implementations of the present technology will now be described, by way of embodiments, with reference to the attached figures, wherein.

DETAILED DESCRIPTION

Figure 1:
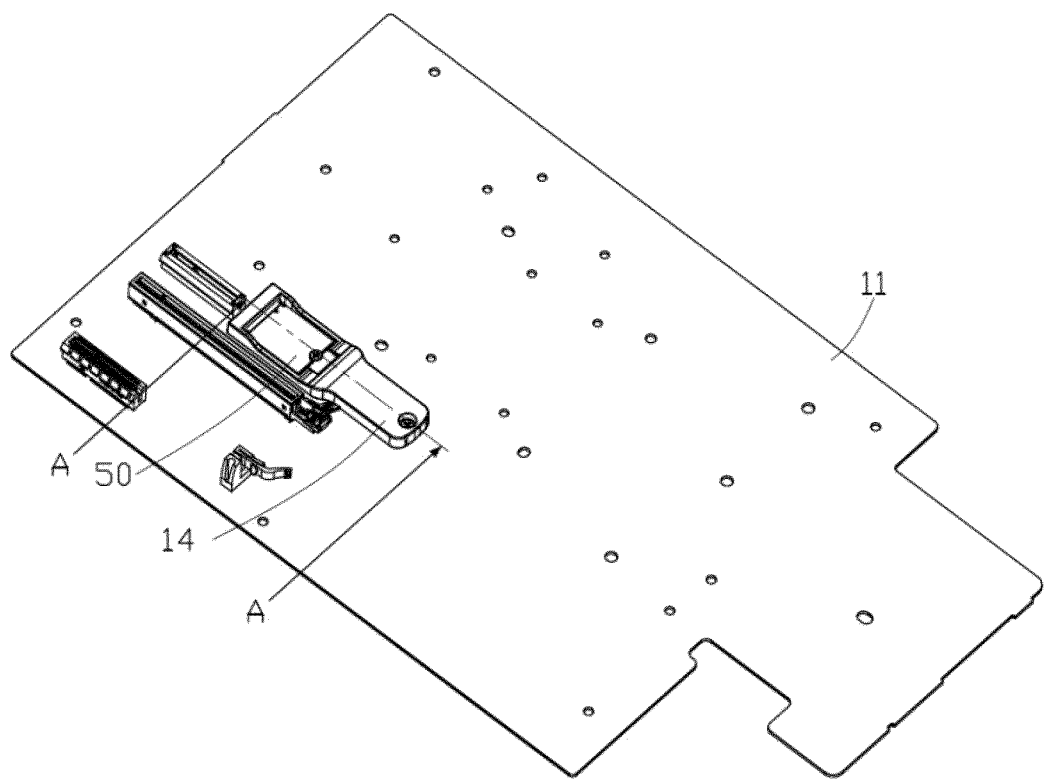
FIG. 1 shows a schematic view of a circuit board assembly in one embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

The technical solutions in the embodiments of the present application will be clearly and completely described below with reference to the accompanying drawings in the embodiments of the present application. Obviously, the described embodiments are only a part of the embodiments of the present application, but not all of the embodiments.

It should be noted that when an element is referred to as being "fixed to" another element, it can be directly on the other element or intervening elements may also be present. When an element is referred to as being "connected" to another element, it can be directly connected to the other element or intervening elements may also be present. When an element is referred to as being "disposed on" another element, it can be directly disposed on the other element or intervening elements may also be present. The terms "vertical" "horizontal" "left" "right" and similar expressions are used herein for illustrative purposes only.

Unless otherwise defined, all technical and scientific terms used herein have the same meaning as commonly understood by one of ordinary skill in the art. The terms used herein in the specification of the present application are for the purpose of describing particular embodiments only, and are not intended to limit the present application. As used herein, the term "or/and" includes any and all combinations of one or more of the associated listed items.

Some embodiments of the present application are described in detail. The following embodiments and features of the embodiments may be combined with each other without conflict.

The purpose of the present application is to provide an SSD card adapter bracket and a circuit board assembly to solve the problem in the prior art that a connection structure needs to be provided on the basic circuit board to adapt to SSD cards of different sizes.

The embodiments of the present application are implemented as follows:

The present application provides an SSD card adapter bracket including a bracket member, a first screw, a conductive bouncing sheet, and a second screw.

The bracket member includes a card base part and an extension part. The card base part has a card slot for installing the SSD card, and the card base part is provided with a screw base on one side of the card slot along the first direction for supporting the ground terminal of the SSD card. The extension part extends along the first direction. One side of the extension part that is close to the screw base is connected to the card base part, and one side of the extension part that is away from the screw base is provided with a connection part.

The first screw is threadedly connected to the screw base and can press the SSD card to the screw base.

The conductive bouncing sheet has a first end part and a second end part opposite to the first end part along the first direction. The first end part is sandwiched between the first screw and the screw base, and the second end part corresponds to the connection part.

The second screw is used for connecting the connection part and the second end part to a support stud.

The ground terminal of the SSD card is electrically connected to the conductive bouncing sheet through the screw base and the first screw. The conductive bouncing sheet is electrically connected to the support stud through the second screw, so as to realize the grounding of the SSD card.

The SSD card adapter bracket in the embodiment of the present application can be used for the installation of the SSD card. In use, the SSD card adapter bracket is installed on the basic circuit board, which can be used to install a shorter SSD card. The SSD card adapter bracket is not installed on the basic circuit board, which can be used to install a longer SSD card. That is, the SSD card adapter bracket can be optionally installed when the shorter SSD card needs to be installed.

Specifically, a connector and the support stud are originally provided on the basic circuit board. The connector and the support stud are spaced apart from each other along the first direction and are respectively used to install two opposite ends of the longer SSD card. The connector is used to connect the connecting fingers of the longer SSD card, and the support stud is used to support the ground terminal of the longer SSD card, so as to realize the communication connection and grounding of the longer SSD card and the basic circuit board.

After the SSD card adapter bracket is installed on the basic circuit board, it can be used to install the shorter SSD card. Specifically, the connection part of the SSD card adapter bracket and the second end part of the conductive bouncing sheet are fixedly connected to the support stud through a second screw, and the shorter SSD card is installed at the card slot. One end (connecting fingers) of the shorter SSD card is connected to the connector, and the other end (ground terminal) of the shorter SSD card is connected between the screw base and the first screw. At the same time, the first end part of the conductive bouncing sheet is sandwiched between the first screw and the screw base, so that the ground terminal of the shorter SSD card is electrically connected to the support stud through the conductive bouncing sheet to realize grounding.

Therefore, the SSD card adapter bracket in one embodiment can be selected and installed only when needed, can flexibly adapt to the installation requirements of the SSD card, thereby improving the convenience of use.

In one embodiment, a support part is provided at the end of the card base part opposite to the screw base along the first direction. The support part is used for supporting upward the part of the SSD card that is between the connecting fingers terminal and the ground terminal.

In one embodiment, a nut member is fixed on the screw base for threaded connection with the first screw.

In one embodiment, the conductive bouncing sheet is in the shape of a sheet and extends along the first direction. The middle portion of the conductive bouncing sheet is fixedly connected to the extension part. The first end part is connected to one end of the middle portion, and is elastically lifted away from the screw base. When the first screw presses the ground terminal of the SSD card against the screw base, the first end part elastically pushes up against the first screw.

In one embodiment, the ground terminal of the SSD card defines a first semicircular notch, and a ground connection point is arranged near the first semicircular notch. A second semicircular notch is formed at one end of the first end part close to the screw base, and the first semicircular notch on the SSD card and the second semicircular notch on the first end part are respectively adapted to the two opposite sides of the first screw.

In one embodiment, the SSD card adapter bracket further includes a shielding sheet, and the shielding sheet is connected to the extension part. The conductive bouncing sheet is sandwiched between the shielding sheet and the bracket member.

In one embodiment, the extension part is box-shaped and defines an accommodating space. The accommodating space has an opening facing downward, and the conductive bouncing sheet and the shielding sheet are sequentially installed in the accommodating space.

An opening is provided at one end of the extension part close to the screw base for allowing the first end part to protrude out of the accommodating space and to cooperate with the first screw at the screw base.

In one embodiment, the connection part is provided with a screw hole, the second end part has a through hole corresponding to the screw hole. The second screw can pass through the screw hole and the through hole and then be threadedly connected to the support screw, so as to press the connection part and the second end part to the support stud, and to electrically connect the second end part and the support stud.

The present application also provides a circuit board assembly including:
   the basic circuit board;
   the connector, wherein the connector is mounted on the basic circuit board;
   the support stud, wherein the support stud is mounted on the basic circuit board and is spaced apart from the connector along the first direction; and
   the aforementioned SSD card adapter bracket, wherein the connection part of the SSD card adapter bracket and the second end part of the conductive bouncing sheet are fixedly connected to the support stud through the second screw, and the connector is located on the side of the card base part away from the screw base.

In one embodiment, the circuit board assembly further includes an SSD card installed in the card slot. The SSD card has a connecting fingers terminal and a ground terminal, the connecting fingers terminal is connected to the connector, and the ground terminal is tightly pressed between the first screw and the screw base.

Figure 2:
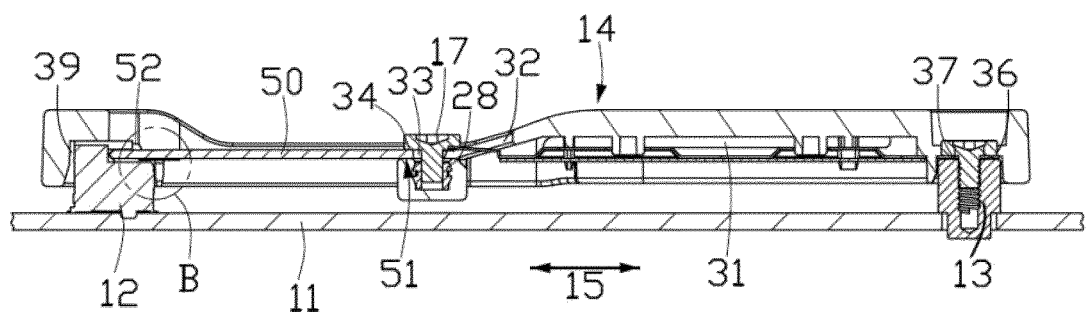
FIG. 2 shows a sectional schematic view along A-A line of FIG. 1.

Referring to FIG. 1 and FIG. 2, a circuit board assembly 10 is provided. The circuit board assembly 10 includes a basic circuit board 11, a connector 12, a support stud 13, and an SSD card adapter bracket 14.

The basic circuit board 11 may be, for example, a motherboard of a desktop computer, a notebook computer or other electronic devices.

The connector 12 is installed on the basic circuit board 11 and is used for connecting the connecting fingers of the SSD card 50 (SSD, Solid State Disk) to realize electrical connection and data communication between the SSD card 50 and the basic circuit board 11.

The support stud 13 is mounted on the basic circuit board 11 and is spaced apart from the connector 12 along the first direction 15. The support stud 13 can be made of metal materials such as copper, and can be used for grounding the SSD card 50.

Figure 3:
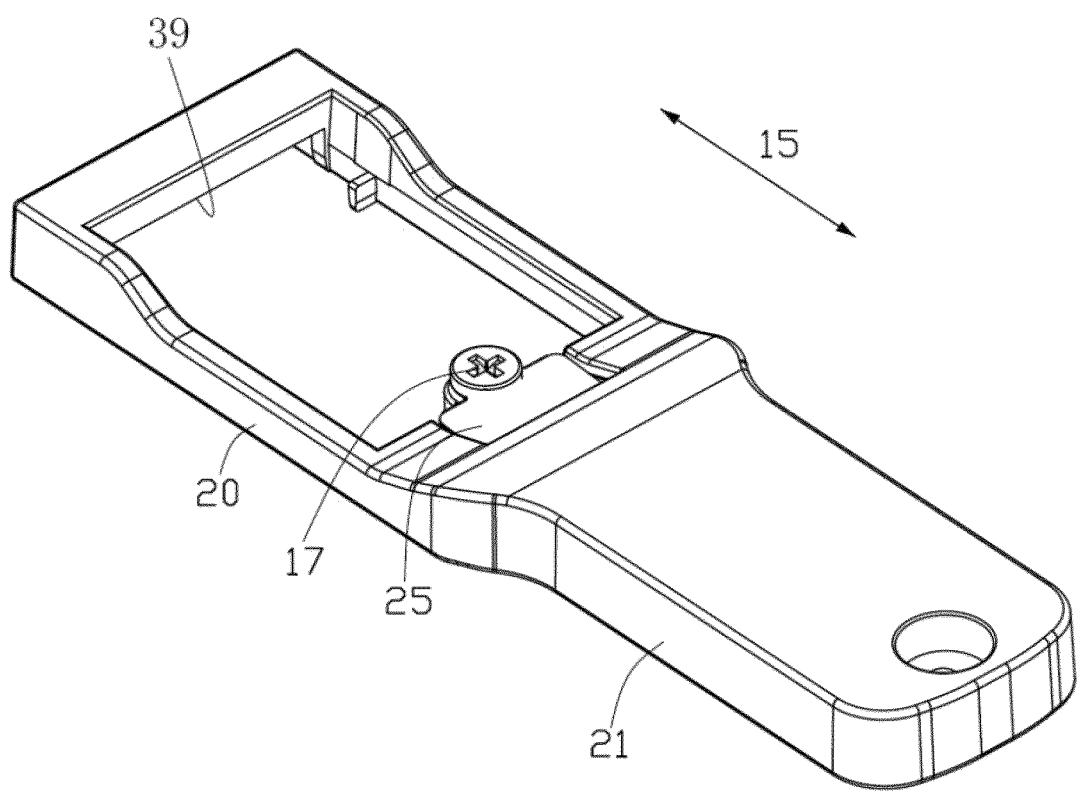
FIG. 3 shows a three-dimensional schematic view of a SSD card adapter bracket in one embodiment of the present application.
Figure 4:
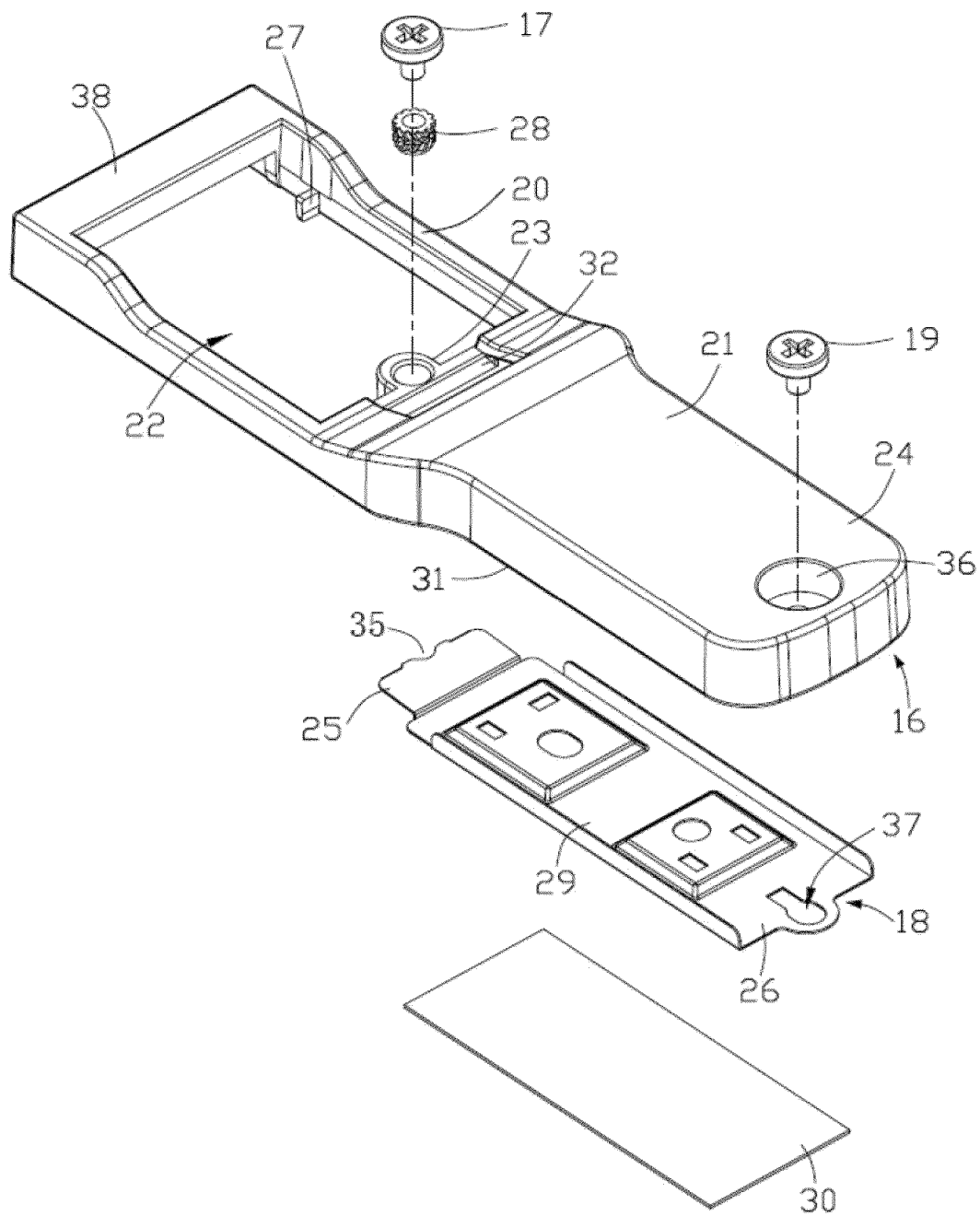
FIG. 4 shows an expanded schematic view of FIG. 3.

Referring to FIG. 3 and FIG. 4, the SSD card adapter bracket 14 includes a bracket member 16, a first screw 17, a conductive bouncing sheet 18, and a second screw 19.

The bracket member 16 includes a card base part 20 and an extension part 21, and the card base part 20 has a card slot 22 for installing the SSD card 50. The card base part 20 includes a screw base 23, the screw base 23 is located on one side of the card slot 22 along the first direction 15, and the screw base 23 is close to the extension part 21. The screw base 23 is used to support the ground terminal 51 of the SSD card 50. The extension part 21 extends along the first direction 15. One side of the extension part 21 that is close to the screw base 23 is connected to the card base part 20, and the other side of the extension part 21 that is away from the screw base 23 is provided with a connection part 24. The first screw 17 is threadedly connected to the screw base 23 and can press the SSD card 50 to the screw base 23. The conductive bouncing sheet 18 has a first end part 25 and a second end part 26 opposite to the first end part 25 along the first direction 15. The first end part 25 is sandwiched between the first screw 17 and the screw base 23, and the second end part 26 corresponds to the connection part 24. The second screw 19 is used to connect the connection part 24 and the second end part 26 to the support stud 13. The ground terminal 51 of the SSD card 50 is electrically connected to the conductive bouncing sheet 18 through the screw base 23 and the first screw 17. The conductive bouncing sheet 18 is electrically connected to the support stud 13 through the second screw 19 to realize the grounding of the SSD card 50.

In one embodiment, the SSD card adapter bracket 14 can be used for installation of the SSD card 50. In use, the SSD card adapter bracket 14 is installed on the basic circuit board 11, and the basic circuit board 11 can be used to install a shorter SSD card (such as an M.2 2230 SSD card). The basic circuit board 11 is not installed with the SSD card adapter bracket 14, the basic circuit board 11 can be used to install a longer SSD card (such as M.2 2280 SSD card). That is, the SSD card adapter bracket 14 can be optionally installed when the shorter SSD card needs to be installed, and the SSD card adapter bracket 14 is not required when there is no need to install the shorter SSD card.

In detail, the basic circuit board 11 is originally provided with the connector 12 and the support stud 13, the connector 12 and the support stud 13 are respectively used to install two opposite ends of the longer SSD card. The connector 12 is used to connect the connecting fingers of the longer SSD card, and the support stud 13 is used to support the ground terminal 51 of the longer SSD card, so as to realize the communication connection and grounding of the longer SSD card and the basic circuit board 11.

After the SSD card adapter bracket 14 is installed on the basic circuit board 11, it can be used for installing the shorter SSD card. Specifically, the connection part 24 of the SSD card adapter bracket 14 and the second end part 26 of the conductive bouncing sheet 18 are fixedly connected to the support stud 13 through the second screw 19, and the shorter SSD card is installed at the card slot 22. One end of (the connecting fingers terminal 52) of the shorter SSD card is connected to the connector 12, and the other end (the ground terminal 51) of the shorter SSD card is connected between the screw base 23 and the first screw 17. At the same time, the first end part 25 of the conductive bouncing sheet 18 is clamped between the first screw 17 and the screw base 23, the ground terminal of the shorter SSD card is electrically connected to the support stud 13 through the conductive bouncing sheet 18 to realize grounding.

Therefore, the SSD card adapter bracket 14 can be selected and installed only when needed, can flexibly adapt to the installation requirements of the SSD card 50, thereby improving the convenience of use by the user.

Figure 5:
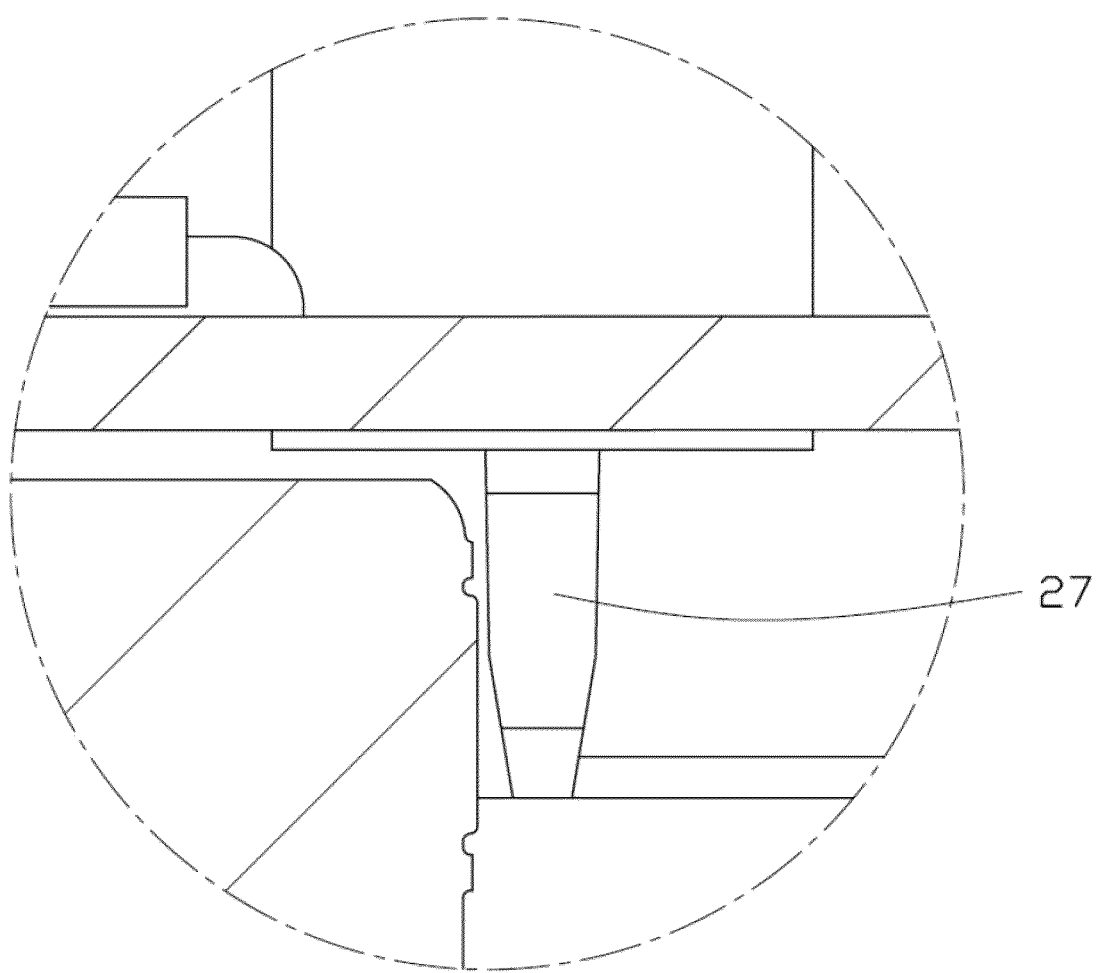
FIG. 5 shows an enlarged schematic view of an area labeled "B" in FIG. 2.

In one embodiment, referring to FIG. 5, a support part 27 is located on a side of the card base part 20 opposite to the screw base 23 along the first direction 15. The support part 27 is used to upward support the part of the SSD card 50 that is between the connecting fingers terminal 52 and the ground terminal 51. Optionally, the supporting position of the SSD card 50 by the support part 27 is located near the connecting fingers terminal 52 thereof. In this way, in addition to the connection between the connecting fingers terminal 52 and the connector 12 and the connection between the ground terminal 51 and the first screw 17, the support part 27 is supported upward, which is beneficial for the connecting fingers terminal 52 of the SSD card 50 to be pressed against the connector 12, to ensure reliable electrical connection between the connecting fingers terminal 52 and the connector 12.

In one embodiment, the entire bracket member 16 may be a plastic member. A nut member 28 is fixed on the screw base 23 for threaded connection with the first screw 17. The nut member 28 can be a hot-melt nut, and the hot-melt nut can be fixed at the screw base 23 of the bracket member 16 by means of hot-melt, and is integrated with the bracket member 16.

The conductive bouncing sheet 18 can be made of a metal material (such as stainless steel). The conductive bouncing sheet 18 is in the shape of a sheet and extends along the first direction 15. The middle portion 29 of the conductive bouncing sheet 18 is fixedly connected to the extension part 21. The first end part 25 is connected to one end of the middle portion 29 and is elastically lifted away from the screw base 23. When the first screw 17 presses the ground terminal 51 of the SSD card 50 against the screw base 23, the first end part 25 elastically pushes up against the first screw 17. The conductive bouncing sheet 18 may be fixedly connected to the extension part 21 by means of heat fusion, hook, thread connection or the like. Optionally, the SSD card adapter bracket 14 further includes a shielding sheet 30. The shielding sheet 30 is connected to the extension part 21 and sandwiches the conductive bouncing sheet 18 together with the bracket member 16. The shielding sheet 30 is made of insulating material (such as plastic), and the shielding sheet 30 is used to insulate the conductive bouncing sheet 18 and the basic circuit board 11, to avoid short circuit caused by accidental contact between the device on the basic circuit board 11 and the conductive bouncing sheet 18. In one embodiment, the extension part 21 is box-shaped and defines an accommodating space 31. The accommodating space 31 has an opening facing downward (that is the accommodating space 31 has an opening toward the basic circuit board 11), and the conductive bouncing sheet 18 and the shielding sheet 30 are sequentially installed in the accommodating space 31. An opening 32 is defined at one end of the extension part 21 close to the screw base 23, and the opening 32 is used for allowing the first end part 25 to protrude out of the accommodating space 31 and cooperate with the first screw 17 at the screw base 23. In one embodiment, the conductive bouncing sheet 18 is shielded by the extension part 21 and will not be exposed upward, so as to avoid affecting the appearance of the structure or contacting with other conductive structures for conduction. That is, the upper side and lower side of the conductive bouncing sheet 18 are insulated and shielded by the extension part 21 and the shielding sheet 30 respectively, which is safe to use.

In this embodiment, the ground terminal 51 of the SSD card 50 defines a first semicircular notch 33, and a ground connection point 34 is located near the first semicircular notch 33. A second semicircular notch 35 is defined at one side of the first end part 25 close to the screw base 23, and the first semicircular notch 33 on the SSD card and the second semicircular notch 35 of the first end part 25 are respectively adapted to the two opposite sides of the first screw 17.

In one embodiment, the connection part 24 defines a screw hole 36, and the second end part 26 defines a through hole 37 corresponding to the screw hole 36. The second screw 19 can pass through the screw hole 36 and the through hole 37 to be threadedly connected to the support stud 13, so as to press the connection part 24 and the second end part 26 against the support stud 13 and electrically connect the second end part 26 and the support stud 13.

Referring to FIG. 2, the connection part 24 of the SSD card adapter bracket 14 and the second end part 26 of the conductive bouncing sheet 18 are fixedly connected to the support stud 13 through the second screw 19, and the connector 12 is located on the side of the card base part 20 away from the screw base 23.

Figure 6:
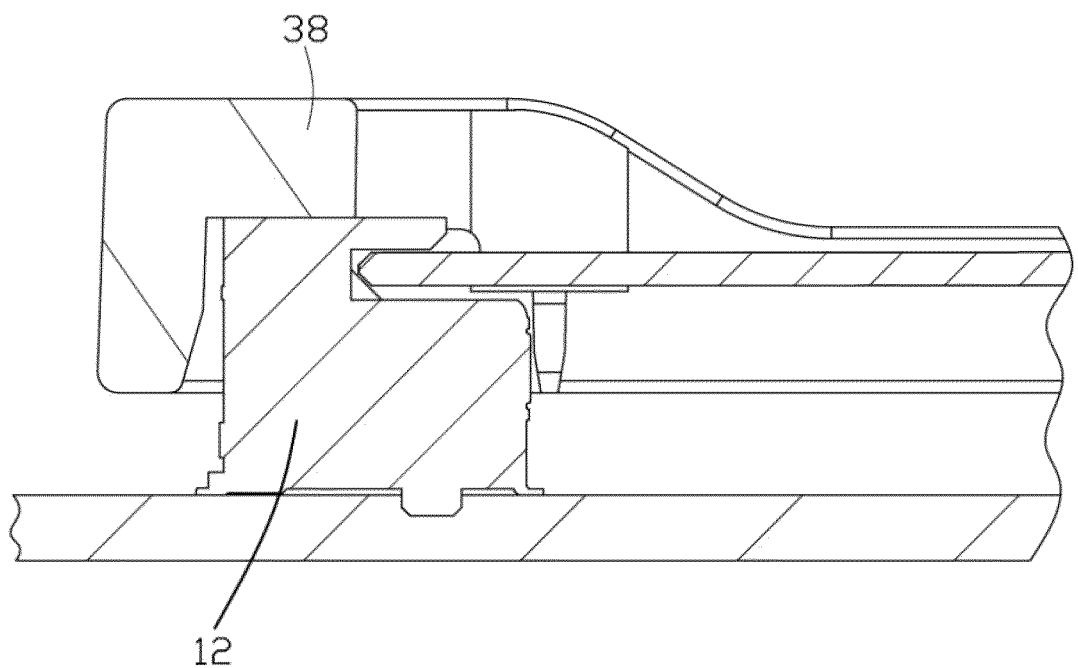
FIG. 6 shows a partial schematic view of FIG. 2.
Figure 7:
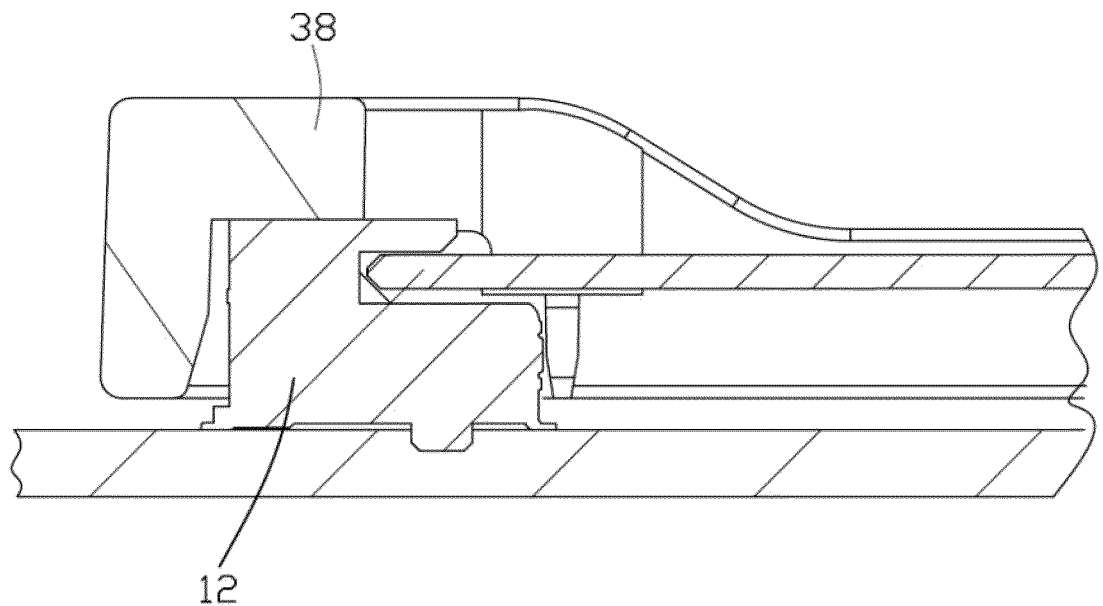
FIG. 7 shows a schematic view of the circuit board assembly wherein a shorter connector is adapted in one embodiment of the present application.
Figure 8:
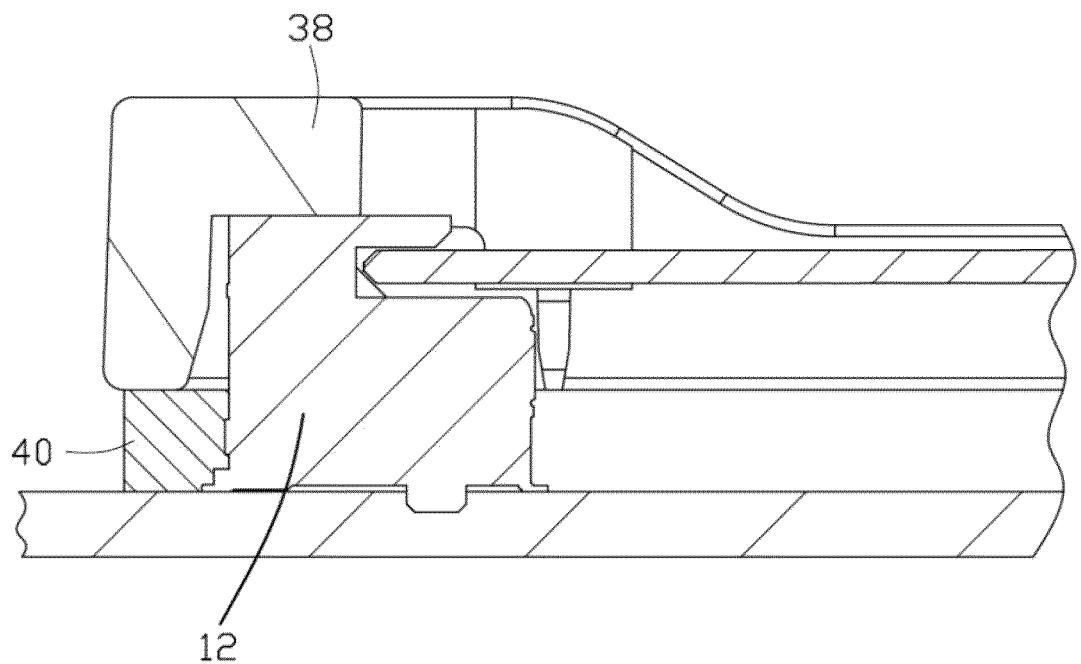
FIG. 8 shows a schematic view of the circuit board assembly wherein a support height of the connector is adjustable in one the embodiment of the present application.

In one embodiment, optionally, an extension bracket 38 is provided on the side of the card base part 20 away from the screw base 23, and the extension bracket 38 may have a downwardly facing match space for matching the connector 12. The extension bracket 38 can be adapted to the connectors 12 of different heights. As shown in FIG. 6, when fitting a taller connector 12, the extension bracket 38 is lifted higher. As shown in FIG. 7, when fitting a shorter connector 12, the lower end of the extension bracket 38 is close to the basic circuit board 11. As shown in FIG. 8, an additional adjustment block 40 can be set to adjust the support height to adapt to connectors 12 of different heights.

Referring to FIG. 2, in one embodiment, the circuit board assembly 10 further includes an SSD card 50, and the SSD card 50 is installed in the card slot 22. The SSD card 50 has a connecting fingers terminal 52 and a ground terminal 51, the connecting fingers terminal 52 is connected to the connector 12, and the ground terminal 51 is pressed between the first screw 17 and the screw base 23.

Based on the above description, the SSD card adapter bracket 14 in the embodiment of the present application can be selected and installed only when needed, can flexibly adapt to the installation requirements of the SSD card 50, thereby improving the convenience of use.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

The above embodiments are only used to illustrate the technical solutions of the present application rather than limitations. Although the present application has been described in detail with reference to the above preferred embodiments, one of ordinary skill in the art should understand that the technical solutions of the present application may be modified or equivalently replaced without departing from the spirit and scope of the technical solutions of the present application.

What is claimed is:

1. An SSD card adapter bracket, comprising: A bracket member comprising a card base part and an extension part, wherein the card base part has a card slot configured for installing an SSD card, and a screw base is located on one side of the card slot in a first direction, the screw base is configured for supporting a ground terminal of the SSD card; and the extension part extends in the first direction, and a side of the extension part close to the screw base is connected to the card base part, and a side of the extension part away from the screw base is provided with a connection part; a first screw, wherein the first screw is threadedly connected to the screw base and press the SSD card to the screw base; a conductive bouncing sheet including a first end part and a second end part opposite to the first end part in the first direction, wherein the first end part is sandwiched between the first screw and the screw base, and the second end part corresponds to the connection part; and a second screw configured for connecting the connection part and the second end part to a support stud, wherein the ground terminal of the SSD card is electrically connected to the conductive bouncing sheet through the screw base and the first screw, and the conductive bouncing sheet is electrically connected to the support stud through the second screw, so as to realize grounding of the SSD card.

2. The SSD card adapter bracket of claim 1, wherein the SSD card has a connecting fingers terminal and the ground terminal, a support part is provided at an end of the card base part opposite to the screw base in the first direction, and the support part supports upwardly a part of the SSD card that is between the connecting fingers terminal and the ground terminal.

3. The SSD card adapter bracket of claim 1, wherein a nut member is fixed on the screw base to provide a threaded connection with the first screw.

4. The SSD card adapter bracket of claim 1, wherein the conductive bouncing sheet is in a shape of a sheet and extends along the first direction, a middle portion of the conductive bouncing sheet is fixedly connected to the extension part, and the first end part is connected to one end of the middle portion and is elastically lifted away from the screw base; and when the first screw presses the ground terminal of the SSD card against the screw base, the first end part elastically pushes up against the first screw.

5. The SSD card adapter bracket of claim 4, wherein the ground terminal of the SSD card defines a first semicircular notch, and a ground connection point is arranged near the first semicircular notch; a second semicircular notch is formed at one end of the first end part close to the screw base, and the first semicircular notch on the SSD card and the second semicircular notch on the first end part are respectively adapted to two opposite sides of the first screw.

6. The SSD card adapter bracket of claim 1, further comprising a shielding sheet connected to the extension part, wherein the conductive bouncing sheet is sandwiched between the shielding sheet and the bracket member.

7. The SSD card adapter bracket of claim 6, wherein the extension part is box-shaped and defines an accommodating space, the accommodating space has an opening facing downward, and the conductive bouncing sheet and the shielding sheet are sequentially installed in the accommodating space; and an opening is defined at one end of the extension part close to the screw base, the opening being configured for the first end part to protrude out of the accommodating space and to cooperate with the first screw at the screw base.

8. The SSD card adapter bracket of claim 1, wherein the connection part defines a screw hole, the second end part defines a through hole corresponding to the screw hole, and the second screw extends through the screw hole and the through hole to be threadedly connected to the support screw, so as to press the connection part and the second end part to the support stud, and to electrically connect the second end part and the support stud.

9. A circuit board assembly, comprising: a basic circuit board; a connector mounted on the basic circuit board; a support stud mounted on the basic circuit board and spaced apart from the connector along the first direction; and a SSD card adapter bracket comprising: a bracket member comprising a card base part and an extension part, wherein the card base part has a card slot configured for installing an SSD card, and a screw base is located on one side of the card slot in a first direction, the screw base is configured for supporting a ground terminal of the SSD card; and the extension part extends in the first direction, and a side of the extension part close to the screw base is connected to the card base part, and a side of the extension part away from the screw base is provided with a connection part; a first screw, wherein the first screw is threadedly connected to the screw base and press the SSD card to the screw base; a conductive bouncing sheet including a first end part and a second end part opposite to the first end part in the first direction, wherein the first end part is sandwiched between the first screw and the screw base, and the second end part corresponds to the connection part; and a second screw configured for connecting the connection part and the second end part to a support stud, wherein the ground terminal of the SSD card is electrically connected to the conductive bouncing sheet through the screw base and the first screw, and the conductive bouncing sheet is electrically connected to the support stud through the second screw, so as to realize grounding of the SSD card; and the connection part of the SSD card adapter bracket and the second end part of the conductive bouncing sheet are fixedly connected to the support stud through the second screw, and the connector is located on a side of the card base part away from the screw base.

10. The circuit board assembly of claim 9, further comprising an SSD card installed in the card slot, wherein the SSD card has a connecting fingers terminal and the ground terminal, the connecting fingers terminal is connected to the connector, and the ground terminal is pressed between the first screw and the screw base.

11. The circuit board assembly of claim 9, wherein the SSD card has a connecting fingers terminal and the ground terminal, a support part is provided at an end of the card base part opposite to the screw base in the first direction, and the support part supports upwardly a part of the SSD card that is between the connecting fingers terminal and the ground terminal.

12. The circuit board assembly of claim 9, wherein a nut member is fixed on the screw base to provide a threaded connection with the first screw.

13. The circuit board assembly of claim 9, wherein the conductive bouncing sheet is in a shape of a sheet and extends along the first direction, a middle portion of the conductive bouncing sheet is fixedly connected to the extension part, and the first end part is connected to one end of the middle portion and is elastically lifted away from the screw base; and when the first screw presses the ground terminal of the SSD card against the screw base, the first end part elastically pushes up against the first screw.

14. The circuit board assembly of claim 13, wherein the ground terminal of the SSD card defines a first semicircular notch, and a ground connection point is arranged near the first semicircular notch; a second semicircular notch is formed at one end of the first end part close to the screw base, and the first semicircular notch on the SSD card and the second semicircular notch on the first end part are respectively adapted to two opposite sides of the first screw.

15. The circuit board assembly of claim 9, further comprising a shielding sheet connected to the extension part, wherein the conductive bouncing sheet is sandwiched between the shielding sheet and the bracket member.

16. The circuit board assembly of claim 15, wherein the extension part is box-shaped and defines an accommodating space, the accommodating space has an opening facing downward, and the conductive bouncing sheet and the shielding sheet are sequentially installed in the accommodating space; and an opening is defined at one end of the extension part close to the screw base, the opening being configured for the first end part to protrude out of the accommodating space and to cooperate with the first screw at the screw base.

17. The circuit board assembly of claim 9, wherein the connection part defines a screw hole, the second end part defines a through hole corresponding to the screw hole, and the second screw extends through the screw hole and the through hole to be threadedly connected to the support screw, so as to press the connection part and the second end part to the support stud, and to electrically connect the second end part and the support stud.

* * * * *